United States Patent
Thompson et al.

(10) Patent No.: US 9,190,126 B2
(45) Date of Patent: Nov. 17, 2015

(54) TRANSISTOR VOLTAGE THRESHOLD MISMATCH COMPENSATED SENSE AMPLIFIERS AND METHODS FOR PRECHARGING SENSE AMPLIFIERS

(71) Applicant: MICRON TECHNOLOGY, INC., Boise, ID (US)

(72) Inventors: J. Wayne Thompson, Boise, ID (US); Howard C. Kirsch, Eagle, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/094,466

(22) Filed: Dec. 2, 2013

(65) Prior Publication Data
US 2014/0085992 A1    Mar. 27, 2014

Related U.S. Application Data

(63) Continuation of application No. 12/815,176, filed on Jun. 14, 2010, now Pat. No. 8,598,912.

(51) Int. Cl.
*G01R 19/00* (2006.01)
*G11C 7/12* (2006.01)
*G11C 7/06* (2006.01)
*G11C 11/4091* (2006.01)
*G11C 11/4094* (2006.01)

(52) U.S. Cl.
CPC .. *G11C 7/12* (2013.01); *G11C 7/06* (2013.01); *G11C 7/065* (2013.01); *G11C 11/4091* (2013.01); *G11C 11/4094* (2013.01)

(58) Field of Classification Search
USPC .......................................................... 327/52
See application file for complete search history.

(56) References Cited

U.S. PATENT DOCUMENTS

| | | | |
|---|---|---|---|
| 3,514,765 A | 5/1970 | Christensen |
| 5,557,234 A | 9/1996 | Collins |
| 5,614,856 A | 3/1997 | Wilson et al. |
| 5,650,970 A | 7/1997 | Kai |
| 5,872,482 A | 2/1999 | Krauss |
| 6,181,621 B1 | 1/2001 | Lovett |
| 6,518,827 B1 | 2/2003 | Fifield et al. |
| 6,566,914 B2 | 5/2003 | Bruneau et al. |

(Continued)

OTHER PUBLICATIONS

Hong, Sanghoon et al., "Low-Voltage DRAM Sensing Scheme with Offset-Cancellation Sense Amplifier", IEEE Journal of Solid-State Circuits, vol. 37, No. 10, Oct. 2002, pp. 1356-1360.

(Continued)

*Primary Examiner* — Daniel Puentes
(74) *Attorney, Agent, or Firm* — Dorsey & Whitney LLP

(57) ABSTRACT

Sense amplifiers and methods for precharging are disclosed, including a sense amplifier having a pair of cross-coupled complementary transistor inverters, and a pair of transistors, each one of the pair of transistors coupled to a respective one of the complementary transistor inverters and a voltage. The sense amplifier further includes a capacitance coupled between the pair of transistors. One method for precharging includes coupling input nodes of the sense amplifier to a precharge voltage, coupling the input nodes of the sense amplifier together, and coupling a resistance to each transistor of a cross-coupled pair to set a voltage threshold (VT) mismatch compensation voltage for each transistor. The voltage difference between the VT mismatch compensation voltage of each transistor is stored.

17 Claims, 4 Drawing Sheets

(56) References Cited

U.S. PATENT DOCUMENTS

| | | |
|---|---|---|
| 6,728,152 B2 | 4/2004 | Van De Graaff |
| 6,754,121 B2 | 6/2004 | Worley |
| 7,606,097 B2 * | 10/2009 | Jung et al. .................... 365/207 |
| 8,111,570 B2 | 2/2012 | Kim et al. |
| 2009/0129188 A1 | 5/2009 | Kim et al. |
| 2009/0295480 A1 * | 12/2009 | Ikeda et al. .................... 330/253 |
| 2010/0039173 A1 | 2/2010 | Chang et al. |
| 2011/0032002 A1 | 2/2011 | Kim et al. |
| 2011/0304358 A1 | 12/2011 | Thompson et al. |

OTHER PUBLICATIONS

Suzuki, Shunichi et al., "Threshold Difference Compensated Sense Amplifier", IEEE Journal of Solid-State Circuits, vol. SC-14, No. 6, Dec. 1979, pp. 1066-1070.

Watanabe, Yohji et al., "Offset Compensating Bit-Line Sensing Scheme for High Density DRAMS's", IEEE Journal of Solid-State Circuits, vol. 29, No. 1, Jan. 1994, pp. 9-13.

* cited by examiner

TRANSISTOR VOLTAGE THRESHOLD MISMATCH COMPENSATED SENSE AMPLIFIERS AND METHODS FOR PRECHARGING SENSE AMPLIFIERS

CROSS-REFERENCE TO RELATED APPLICATION

This application is a continuation of U.S. patent application Ser. No. 12/815,176, filed Jun. 14, 2010. This application is incorporated by reference herein in its entirety and for all purposes.

TECHNICAL FIELD

Embodiments of the present invention relate generally to integrated memory devices, and more specifically, to sense amplifiers that compensate for threshold voltage differences in the transistors of the sense amplifier.

BACKGROUND OF THE INVENTION

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be sensed and amplified by a sense amplifier to indicate the value of the data state stored in the memory cell.

Conventional sense amplifiers are typically coupled to a pair of complementary digit lines to which a large number of memory cells (not shown) are connected. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line does not and serves as a reference for the sensing operation. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

The digit lines are precharged during a precharge period to a precharge voltage, such as one-half of a supply voltage, so that a voltage difference can be accurately sensed and amplified during a subsequent sensing operation. However, due to random threshold voltage mismatch of transistor components, the digit lines may be abruptly imbalanced before a voltage change is sensed and amplified on one of the digit lines. Such threshold voltage deviations can cause the sense amplifier to erroneously amplify input signals in the wrong direction. There is, therefore, a need for a sense amplifier design that reduces threshold voltage mismatches.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
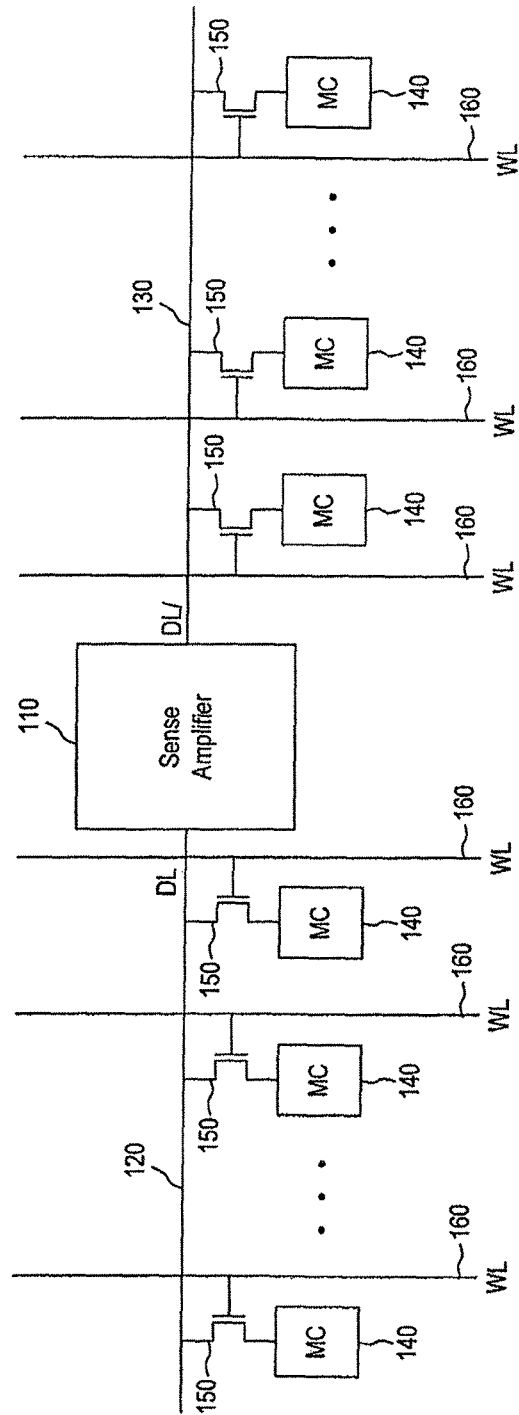
FIG. 1 is a block diagram of a portion of a sense amplifier and digit line arrangement.

FIG. 1 illustrates a portion of a sense amplifier and digit line arrangement. A sense amplifier 110 is coupled to digit lines 120, 130. Memory cells 140 are coupled through respective access devices (e.g., transistors) 150 to either the digit line 120 or 130. In operation, a memory cell 140 is coupled to a digit line 120, 130 through the respective access device 150 in response to a respective word line 160 becoming active. A data state stored by the memory cell 140 is sensed by the sense amplifier 110 and amplified by driving the digit line to which that memory cell is coupled to a high or low voltage level corresponding to the sensed data state. The other digit line is driven to the complementary voltage level.

Figure 2:
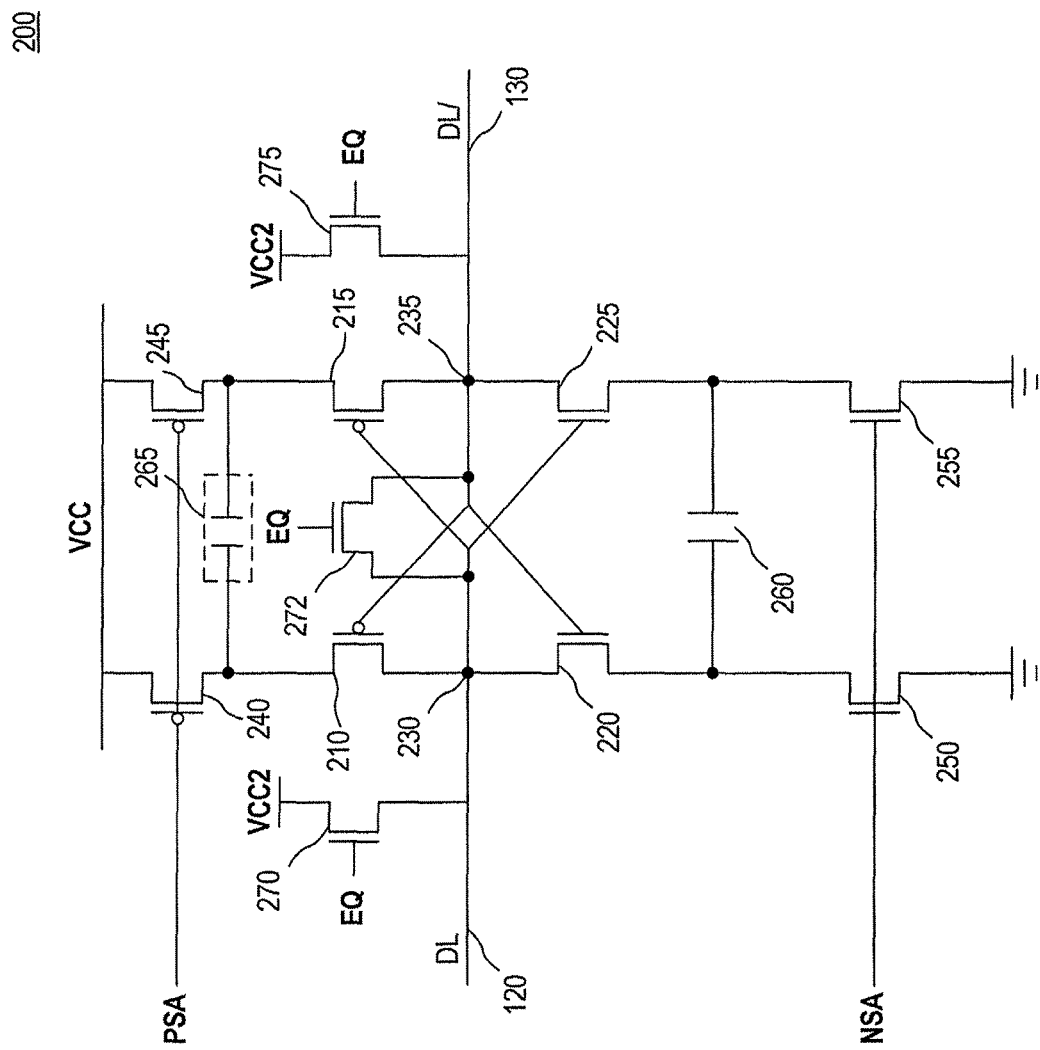
FIG. 2 is a schematic diagram of a sense amplifier according to an embodiment of the invention.

FIG. 2 is a schematic diagram of a sense amplifier 200 according to an embodiment of the invention. The sense amplifier 200 includes p-type field effect transistors (PFET) 210, 215 having drains coupled to drains of n-type field effect transistors (NFET) 220, 225. The PFETs 210, 215 and NFETs 220, 225 form complementary transistor inverters. The PFETs 210, 215 are coupled through PFETs 240, 245 to a supply voltage (e.g., VCC) under the control of p-sense control signal PSA. The NFETs 220, 225 are coupled through respective NFETs 250, 255 to a reference voltage (e.g., ground) under the control of n-sense control NSA. A capacitance, such as a discrete 260, couples the sources of NFETs 220, 225. The sense amplifier 200 senses and amplifies the data state applied to input/output (IO) nodes 230, 235 through the digit lines 120, 130, respectively. The IO nodes are also coupled through NFETs 270, 275 to a precharge voltage (e.g., VCC2, which is one-half of VCC) and through NFET 272 to each other under the control of an equilibration signal EQ. The NFETs 270, 272, 275 are used to "precharge" the sense amplifier 200 in preparation for a sense and amplify operation.

Figure 3B:
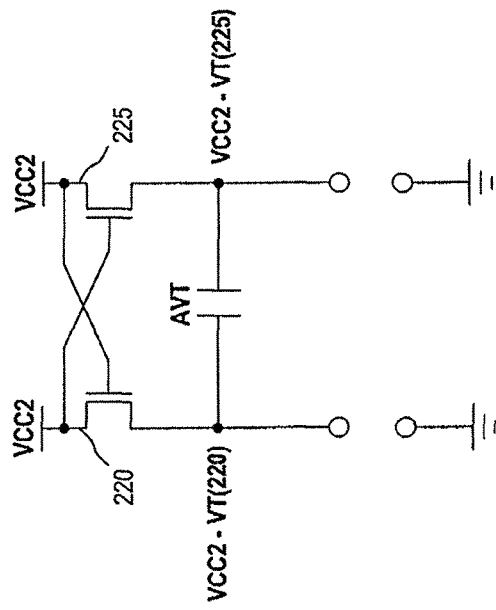
FIGS. 3A and 3B are schematic diagrams of the sense amplifier of FIG. 2 during operation according to an embodiment of the invention.
Figure 3A:
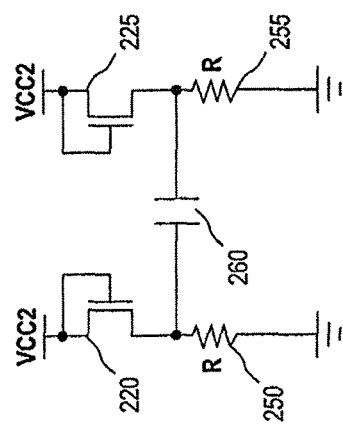

In operation, the sense amplifier 200 is precharged to a precharge voltage VCC2 and the IO nodes 230, 235 are equilibrated by an active EQ signal. Additionally, the NFETs 250, 255 are biased by the NSA signal to provide resistance. That is, the voltage of the NSA signal places the NFETs 250, 255 into a linear region of operation and the transistors effectively behave as resistors. In this mode, the NFETs 220, 225 are effectively diode coupled to VCC2 with the sources coupled to ground through a resistor, as illustrated in FIG. 3A. As a result, the voltages at the sources of the NFETs 220, 225 is the VCC2 voltage less the respective voltage threshold (VT) for each of the transistors: the voltage at the source of NFET 220 is (VCC2-VT(220)) and the voltage at the source of NFET 225 is (VCC2-VT(225)). Any VT imbalance between the NFETs 220 and 225 will result in a voltage difference between the sources of the NFETs that is stored by the capacitance 260. The stored voltage difference stored by the capacitance 260 provides voltage compensation for VT mismatch of the NFETs 220, 225. Following the setting of the VT mismatch compensation voltage at the sources of NFETs 220, 225, the NFETs 250, 255 are made non-conductive to capture the voltages (VCC2-VT(220)), (VCC2-VT(225)) at the sources of NFETs 220, 225 as well as any voltage difference across the capacitance 260 as shown in FIG. 3B. The EQ signal is deactivated to end the precharge operation resulting in both IO nodes 230, 235 set at the VCC2 voltage.

Normal sense and amplify operations are then performed, but benefit from the VT mismatch compensation voltage to balance the response of the NFETs 220, 225. For example, in response to a memory cell 140 being coupled to a digit line through its respective access device 150 (FIG. 1), a voltage difference is created between the IO nodes 230, 235. The voltage difference is sensed by NFETs 220, 225 as the sources of the NFETs 220, 225 begin to be pulled to ground through fully activated NFETs 250, 255, and the NFET with a gate coupled to the IO node with the slightly higher voltage begins conducting. Assuming a memory cell coupled to the IO node 230 through the digit line stores a high data state, for example, the NFET 225 will begin conducting. Additionally, the other NFET becomes less conductive as the voltage of the other IO node with the slightly lower voltage decreases through the conducting NFET. With the VT mismatch compensation voltage stored by the capacitance 260 between the sources, the NFETs 220, 225 are in a balanced state of activation, and a smaller voltage difference across the IO nodes 230, 235 may be sensed because any VT mismatch between the NFETs 220, 225 does not need to be overcome by the voltage difference created at the IO nodes 230, 235 by the coupling of the memory cell to the digit line.

The PFETs 210, 215 are coupled to VCC through activated PFETs 240, 245, and the PFET having a gate coupled to the IO node that is pulled to ground through the NFET (i.e., the IO node having the slightly lower voltage) becomes conductive to pull the other IO node (i.e., the IO node having the slightly higher voltage) to VCC. Using the previous example, the PFET 210 will begin conducting. The positive feedback resulting from the conductive PFET and NFET amplify the sensed state until the IO node initially having the slightly higher voltage is pulled to VCC and the IO node initially having the slightly lower voltage is pulled to ground.

An optional capacitance 265 may couple the sources of PFETs 210, 215 to provide VT mismatch compensation voltage for a VT mismatch between PFETs 210, 215. During precharge, the PFETs 210, 215 are effectively diode coupled. With the PFETs 240, 245 biased by the PSA signal to provide resistance, the voltage developed at the sources will be VCC2 plus the VT of the respective PFET 210, 215. Any VT imbalance between the PFETs 210, 215 will result in a voltage difference between the sources of the PFETs that is stored by the capacitance. Operation to provide PFET VT mismatch compensation will be similar to that for providing NFET VT mismatch compensation as previously described.

In some embodiments, the frequency of developing a voltage difference across the capacitance 260 to provide VT mismatch compensation may occur with every precharge cycle of the sense amplifier 200. In other embodiments, the frequency is less than every precharge cycle. Additionally, changing the capacitance 260 will alter the time a VT difference voltage is stored by the capacitance.

Figure 4:
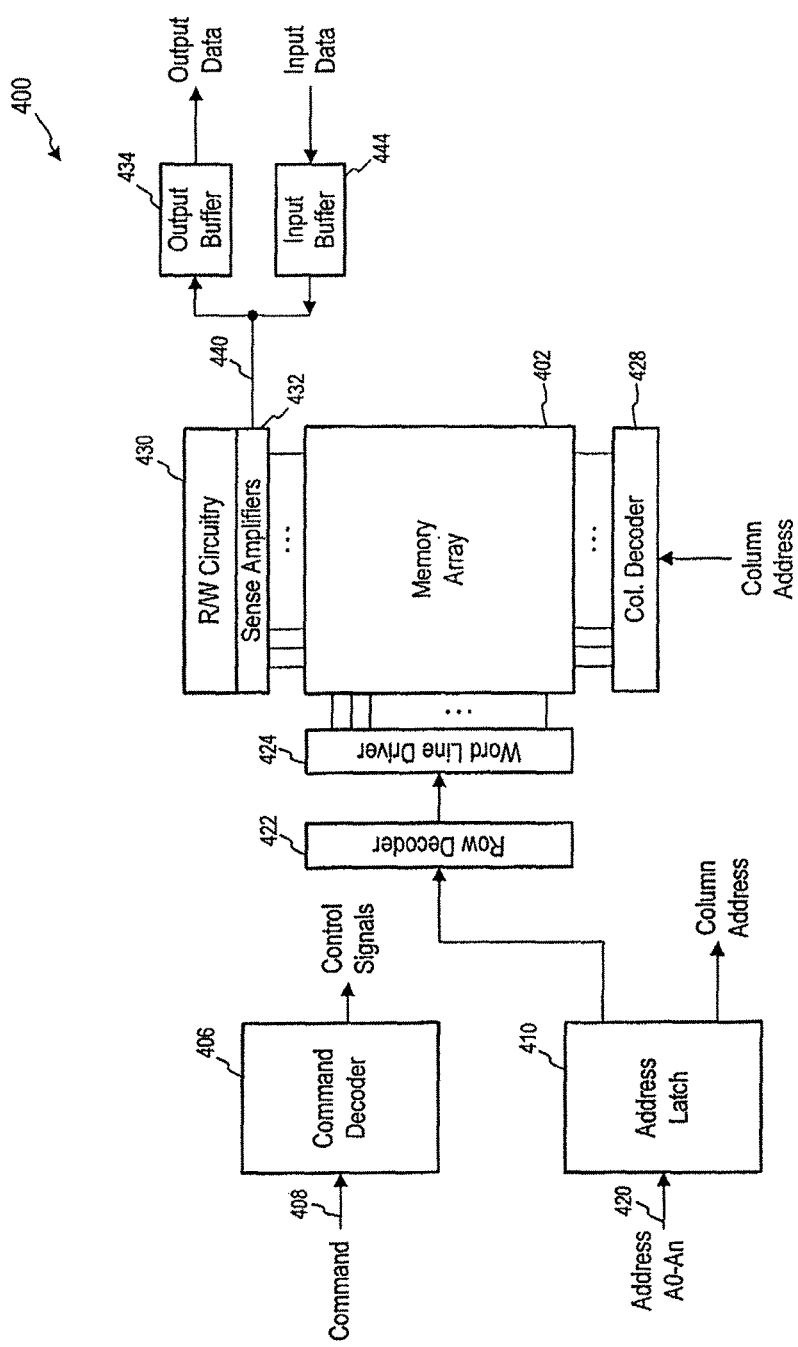
FIG. 4 is a block diagram of a memory including a sense amplifier according to an embodiment of the invention.

FIG. 4 illustrates a portion of a memory 400 according to an embodiment of the present invention. The memory 400 includes an array 402 of memory cells, which may be, for example, DRAM memory cells, SRAM memory cells, flash memory cells, or some other types of memory cells. The memory system 400 includes a command decoder 406 that receives memory commands through a command bus 408 and generates corresponding control signals within the memory system 400 to carry out various memory operations. Row and column address signals are applied to the memory system 400 through an address bus 420 and provided to an address latch 410. The address latch then outputs a separate column address and a separate row address.

The row and column addresses are provided by the address latch 410 to a row address decoder 422 and a column address decoder 428, respectively. The row address decoder 422 is connected to word line driver 424 that activates respective rows of memory cells in the array 402 corresponding to received row addresses. In response, memory cells of the array 402 are coupled to digit lines extending through the array 402 for the respective data states to be sensed by sense amplifiers 432. The sense amplifiers 432 include at least one sense amplifier according to an embodiment of the invention. The column address decoder 428 selects the sense amplifier coupled to the digit lines corresponding to respective column addresses. The selected digit lines corresponding to a received column address are coupled to read/write circuitry 430 to provide read data to a data output buffer 434 via an input-output data bus 440. Write data are applied to a data input buffer 444 and the memory array read/write circuitry 430. The write data are written to the memory cells of the array 402 through the sense amplifiers 432. The command decoder 406 responds to memory commands applied to the command bus 408 to perform various operations on the memory array 402. In particular, the command decoder 406 is used to generate internal control signals to read data from and write data to the memory array 402.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   first and second field-effect transistors (FETs), the first and second FETs having a respective drain configured to receive a respective input signal; and
   a capacitance coupled between sources of the first and second FETs, the capacitance configured to store a voltage difference between the sources of the first and second FETs to compensate for threshold voltage differences between the first and second FETs; and
   third and fourth FETs, the third FET coupled to the drain of the first FET and the fourth FET coupled to the drain of the second FET, wherein an equilibration signal is applied to a gate of the third FET and a gate of the Fourth FET.

2. The apparatus of claim 1, further comprising:
   an equilibration transistor coupled to the drain of the first FET and the drain of the second FET and configured to receive an equilibration signal, the equilibration transistor configured to couple the drain of the first FET to the drain of the second FET responsive to the equilibration signal.

3. The apparatus of claim 1, further comprising fifth and sixth FETs, the fifth FET having a drain coupled to the drain of the first FET and the sixth FET having a drain coupled to the drain of the second FET.

4. The apparatus of claim 1, wherein the capacitance is configured to store the voltage difference during each of a plurality of precharge cycles.

5. The apparatus of claim 1, wherein the first and second FETs and the capacitance are included in a sense amplifier.

6. The apparatus of claim 1, wherein the first FET has a gate coupled to the drain of the second FET and the second FET has a gate coupled to the drain of the first FET.

7. An apparatus, comprising:
a FET of a first complementary transistor inverter;
a FET of a second complementary transistor inverter; and
a capacitance coupled between the FETs of the first and second complementary transistor inverters and configured to store a voltage difference, the voltage difference based on respective threshold voltages of the first and second FETs;
a first FET configured to couple a drain of the FET of the first complementary transistor inverter to a supply voltage responsive to an equilibration signal; and
a second FET configured to couple a drain of the FET of the second complementary transistor inverter to the supply voltage responsive to the equilibration signal.

8. The apparatus of claim 7, wherein the FET of the first complementary transistor inverter is a first FET of the first complementary transistor inverter and the FET of the second first complementary transistor inverter is a first FET of the second complementary transistor inverter further comprising:
a second FET of the first complementary transistor inverter; and
a second FET of the second complementary transistor inverter,
wherein gates of each of the first and second FETs of the first complementary inverter are coupled to drains of the first and second FETs of the second complementary inverter.

9. A method, comprising:
biasing first and second transistors to operate in a linear region of operation, the first transistor having a first voltage threshold and the second transistor having a second voltage threshold;
storing a voltage difference, the voltage difference based on the first and second voltage thresholds;
precharging a third transistor coupled to a drain of the first transistor by applying an equilibration signal to a gate of the third transistor; and
precharging a fourth transistor coupled to a drain of the second transistor by applying an equilibration signal to a gate of the fourth transistor.

10. The method of claim 9, wherein storing a voltage difference comprises:
storing the voltage difference between a source of the first transistor and a source of the second transistor.

11. The method of claim 9, wherein the voltage difference is a first voltage difference, the method further comprising:
biasing fifth and sixth transistors to operate in a linear region of operation, the fifth transistor having a third voltage threshold and the sixth transistor having a fourth voltage threshold.

12. The method of claim 9, wherein storing a voltage difference comprises storing the voltage difference in a capacitance.

13. A method, comprising:
precharging input nodes of a sense amplifier that includes a pair of cross-coupled transistors by applying an equilibration signal to a gate of a first transistor and a second transistor; and
storing a voltage difference between the sources of the pair of cross-coupled transistors to compensate for threshold voltage differences between the pair of cross-coupled transistors.

14. The method of claim 13, further comprising:
biasing a pair of transistors to create the voltage difference.

15. The method of claim 14, wherein biasing a pair of transistors to create the voltage difference comprises:
biasing a first transistor of the pair of transistors having a first voltage threshold; and
biasing a second transistor of the pair of transistors having a second voltage threshold different than the first voltage threshold.

16. The method of claim 13, wherein storing a voltage difference between the sources of the pair of cross-coupled transistors to compensate for threshold voltage differences between the pair of cross-coupled transistors comprises:
selectively storing the voltage difference during a precharge cycle.

17. The method of claim 16, storing a voltage difference between the sources of the pair of cross-coupled transistors to compensate for threshold voltage differences between the pair of cross-coupled transistors comprises:
storing the voltage difference for an amount of time, the amount of time based on a magnitude of a capacitance.

* * * * *